United States Patent
Schaeffer et al.

(10) Patent No.: US 7,655,550 B2
(45) Date of Patent: Feb. 2, 2010

(54) METHOD OF MAKING METAL GATE TRANSISTORS

(75) Inventors: James K. Schaeffer, Austin, TX (US); David C. Gilmer, Austin, TX (US); Mark V. Raymond, Austin, TX (US); Philip J. Tobin, Austin, TX (US); Srikanth B. Samavedam, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 217 days.

(21) Appl. No.: 11/427,980

(22) Filed: Jun. 30, 2006

(65) Prior Publication Data

US 2008/0001202 A1    Jan. 3, 2008

(51) Int. Cl.
*H01L 21/4763* (2006.01)

(52) U.S. Cl. ............ 438/592; 438/591; 438/257; 257/310; 257/407

(58) Field of Classification Search ............ 257/310, 257/407, 412, E21.021, E29.158; 438/589, 438/272, 785, 591
See application file for complete search history.

(56) References Cited

U.S. PATENT DOCUMENTS

| 5,854,097 | A | 12/1998 | Ohmi et al. |
| 6,794,232 | B2 * | 9/2004 | Zheng et al. ......... 438/186 |
| 6,855,641 | B2 * | 2/2005 | Ryu et al. .............. 438/767 |
| 7,160,781 | B2 * | 1/2007 | Luan ..................... 438/287 |
| 2003/0129795 | A1 | 7/2003 | Chau et al. |
| 2007/0262451 | A1 * | 11/2007 | Rachmady et al. ..... 257/758 |

* cited by examiner

*Primary Examiner*—Thinh T Nguyen
(74) *Attorney, Agent, or Firm*—James L. Clingan, Jr.; Daniel D. Hill

(57) ABSTRACT

A semiconductor device has a gate with three conductive layers over a high K gate dielectric. The first layer is substantially oxygen free. The work function is modulated to the desired work function by a second conductive layer in response to subsequent thermal processing. The second layer is a conductive oxygen-bearing metal. With sufficient thickness of the first layer, there is minimal penetration of oxygen from the second layer through the first layer to adversely impact the gate dielectric but sufficient penetration of oxygen to change the work function to a more desirable level. A third layer, which is metallic, is deposited over the second layer. A polysilicon layer is deposited over the third layer. The third layer prevents the polysilicon layer and the oxygen-bearing layer from reacting together.

19 Claims, 4 Drawing Sheets

METHOD OF MAKING METAL GATE TRANSISTORS

FIELD OF THE INVENTION

This invention relates to integrated circuits, and more particularly, to a method of making transistors that have a metal gate.

BACKGROUND OF THE INVENTION

One of the continuing issues with the use of metal gate transistors is the ability to achieve the desired work function while not adversely impacting the gate dielectric. One of the issues in implementing higher K dielectrics for gate dielectrics is that there is some native oxide that forms that has the effect of reducing the overall dielectric constant of the gate dielectric. This oxide tends to increase in thickness with subsequent processing. A variety of metals and metal alloys have been proposed for use as the gate but no one material is optimum for both N and P channel transistors. The choice for one transistor type can make it difficult to achieve the desired work function for the other transistor type.

Thus, there is a need for a metal gate technique for one transistor type that improves on the combination of desires to be integratable with other transistor types, have minimal adverse impact on the gate dielectric, and achieve the desired work function.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings.

DETAILED DESCRIPTION OF THE INVENTION

In one aspect a semiconductor device has a gate with three conductive layers over a high K gate dielectric. The first layer is substantially oxygen free. The work function is modulated to the desired work function by a second conductive layer in response to subsequent thermal processing. The second layer is a conductive oxygen-bearing metal. The thickness of the first metal layer should be selected so that it is thin enough to allow a sufficient penetration of oxygen from the oxygen bearing layer into the first metal layer to change the work function to a more desirable level, but thick enough so that too much oxygen does not penetrate the first metal layer where it can adversely impact dielectric properties such as effective oxide thickness. Likewise, the thickness of the oxygen bearing layer should be thick enough to provide a sufficient amount of oxygen to the first metal layer to improve the work function properties, but thin enough to not adversely impact the dielectric properties. A third layer, which is metallic, is deposited over the second layer. A polysilicon layer is deposited over the third layer. The third layer prevents the polysilicon layer and the oxygen-bearing layer from reacting together. This is better understood by reference to the drawings and the following description.

Figure 1:
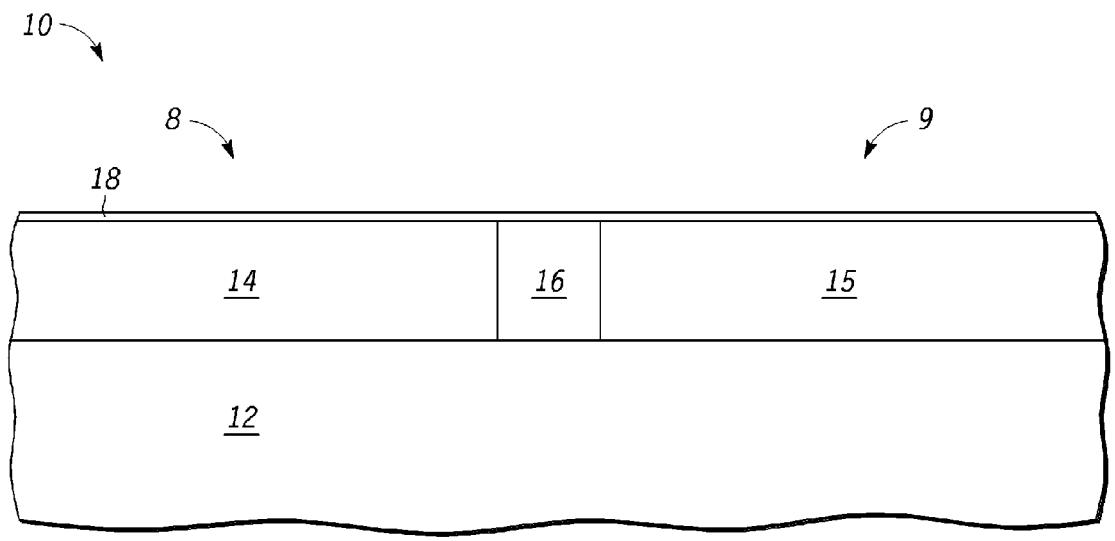
FIG. 1 is a cross section of a semiconductor device at a stage in a process that is according to an embodiment of the invention.

Shown in FIG. 1 is a semiconductor device structure 10 having an insulating layer 12, a semiconductor portion on insulating layer 12 made up of a semiconductor layer 14 and a semiconductor layer 15 on insulating layer 12, a trench isolation 16 in the semiconductor portion between semiconductor layers 14 and 15, and a dielectric layer 18 over semiconductor layers 14 and 15. Semiconductor layers 14 and 15 and insulating layer 12 together form a conventional semiconductor-on-insulator (SOI) substrate. Semiconductor layers 14 and 15 in this example are silicon but other semiconductor layers could be used. Trench dielectric 16 is formed in conventional fashion and is preferably oxide. Gate dielectric 18 is preferably a high K dielectric, preferably hafnium oxide but could be another dielectric, a different high K dielectric for example. Region 8 on one side of semiconductor device 10 is for making one transistor type and corresponds to semiconductor layer 14, and region 9 on the other side of semiconductor device structure 10 for making a different transistor type and corresponds to semiconductor layer 15. In this example, region 8 is for an N channel transistor, and region 9 is for a P channel transistor. Thus, semiconductor layer 14 has been doped in preparation for becoming a channel for an N channel transistor, and semiconductor layer 15 has been doped in preparation for becoming a P channel transistor. For hafnium oxide as gate dielectric 18, a thickness may be 30 Angstroms.

Figure 2:
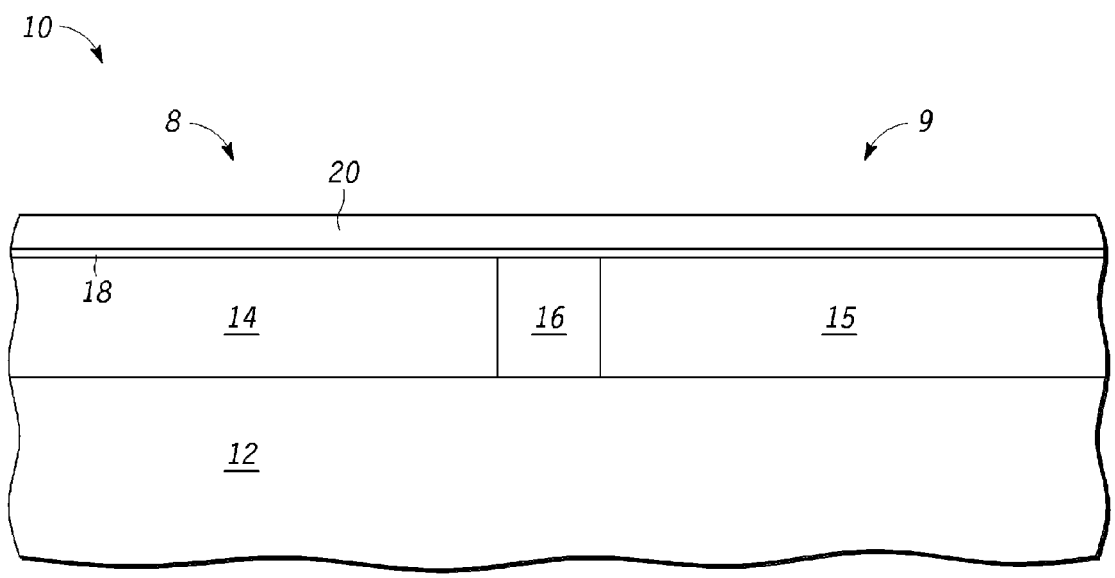
FIG. 2 is a cross section of the semiconductor device at a stage in the process subsequent to that shown in FIG. 1.

Shown in FIG. 2 is semiconductor device structure 10 after depositing a metal layer 20 to a thickness may be about 70 Angstroms. One metal for metal layer 20 that has been found to be effective is tantalum carbide (TaC).

Figure 3:
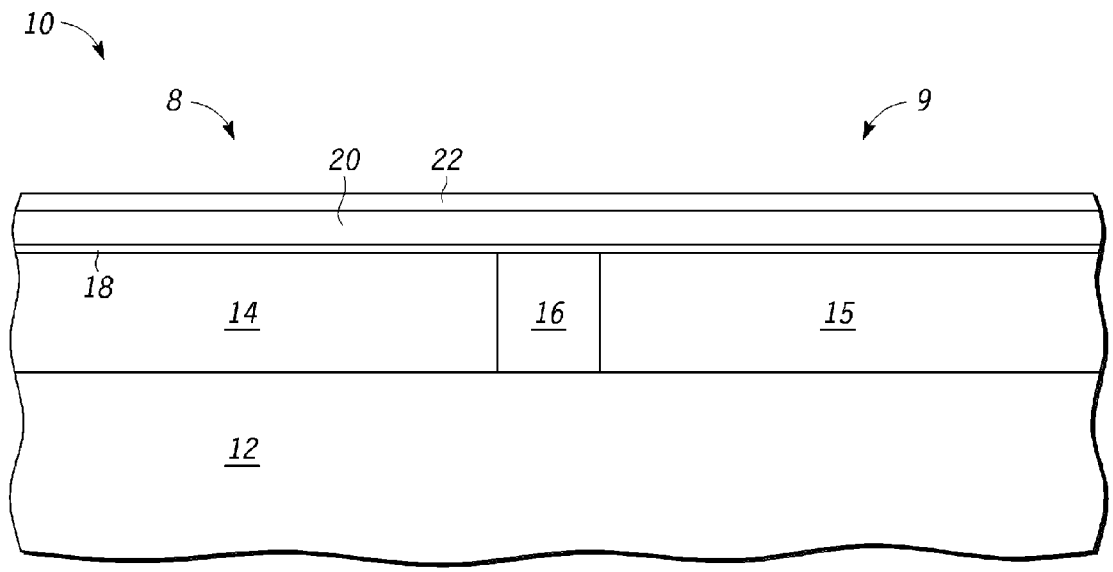
FIG. 3 is a cross section of the semiconductor device at a stage in the process subsequent to that shown in FIG. 2.

Shown in FIG. 3 is semiconductor device structure 10 after deposition of a layer 22 of a conductive oxygen-bearing metal, to a thickness of about 20 Angstroms. One conductive oxygen-bearing metal that has been found to be effective is molybdenum oxynitride.

Figure 4:
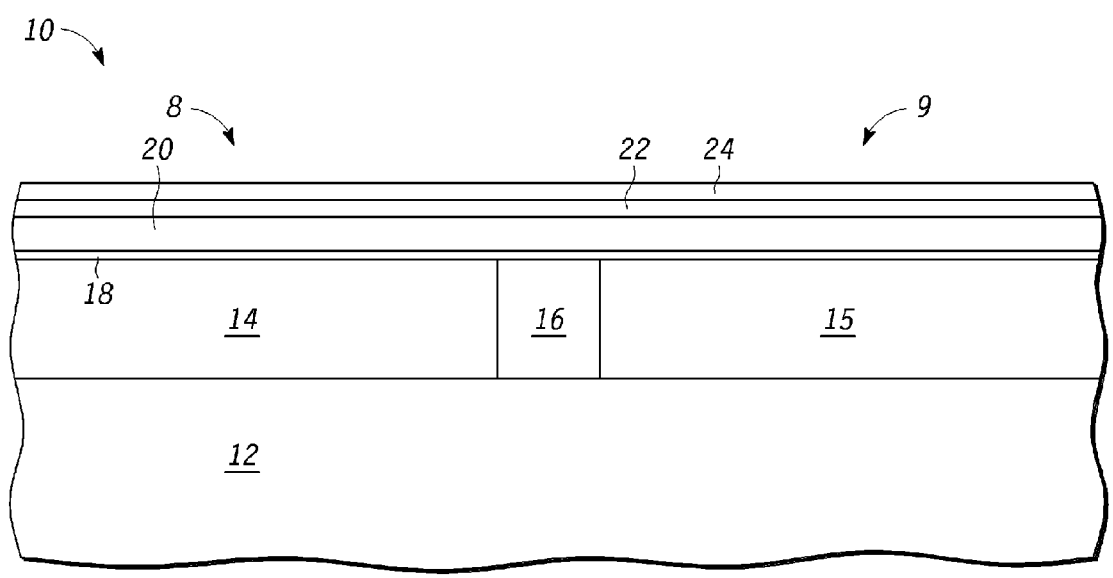
FIG. 4 is a cross section of the semiconductor device at a stage in the process subsequent to that shown in FIG. 3.

Shown in FIG. 4 is semiconductor device structure 10 after deposition of a metal layer 24 to a thickness of about 70 Angstroms. One metal for metal layer 24 that has been found to be effective is titanium nitride (TiN).

Figure 5:
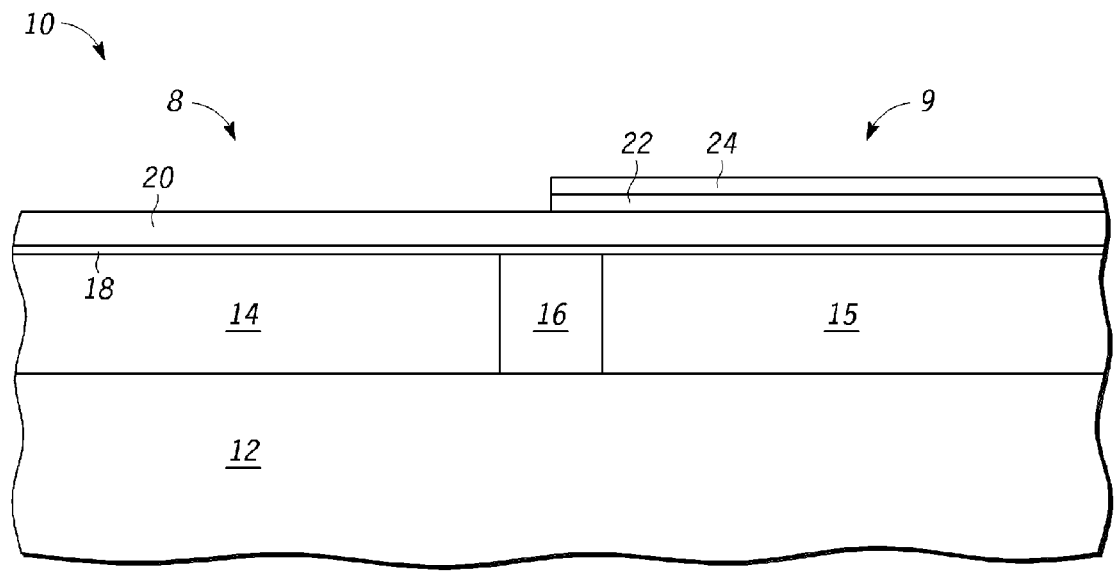
FIG. 5 is a cross section of the semiconductor device at a stage in the process subsequent to that shown in FIG. 4.

Shown in FIG. 5 is semiconductor device structure 10 after masking and etching metal layer 24 and layer 22 from over region 8. This results semiconductor device structure 10 having layer 22 and metal layer 24 remaining in region 9 but removed from region 8.

Figure 6:
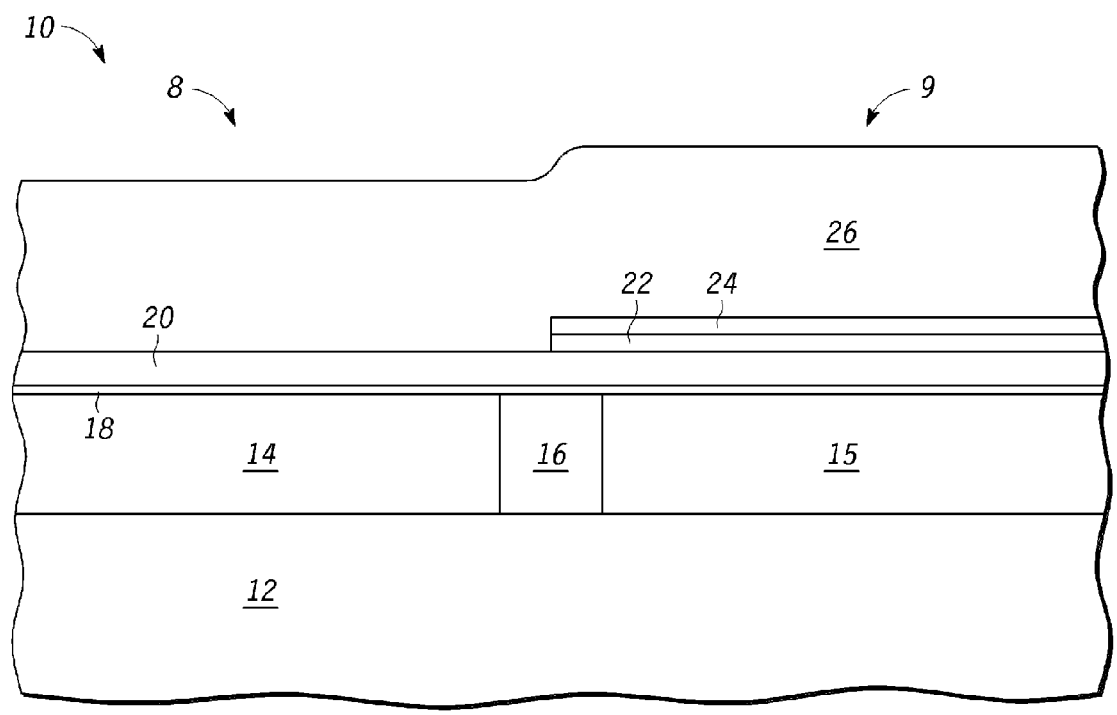
FIG. 6 is a cross section of the semiconductor device at a stage in the process subsequent to that shown in FIG. 5.

Shown in FIG. 6 is semiconductor device structure 10 after depositing a polysilicon layer 26 to a thickness of about 1000 Angstroms. Thus, polysilicon layer 26 is on metal layer 24 in region 9 and on metal layer 20 in region 8.

Figure 7:
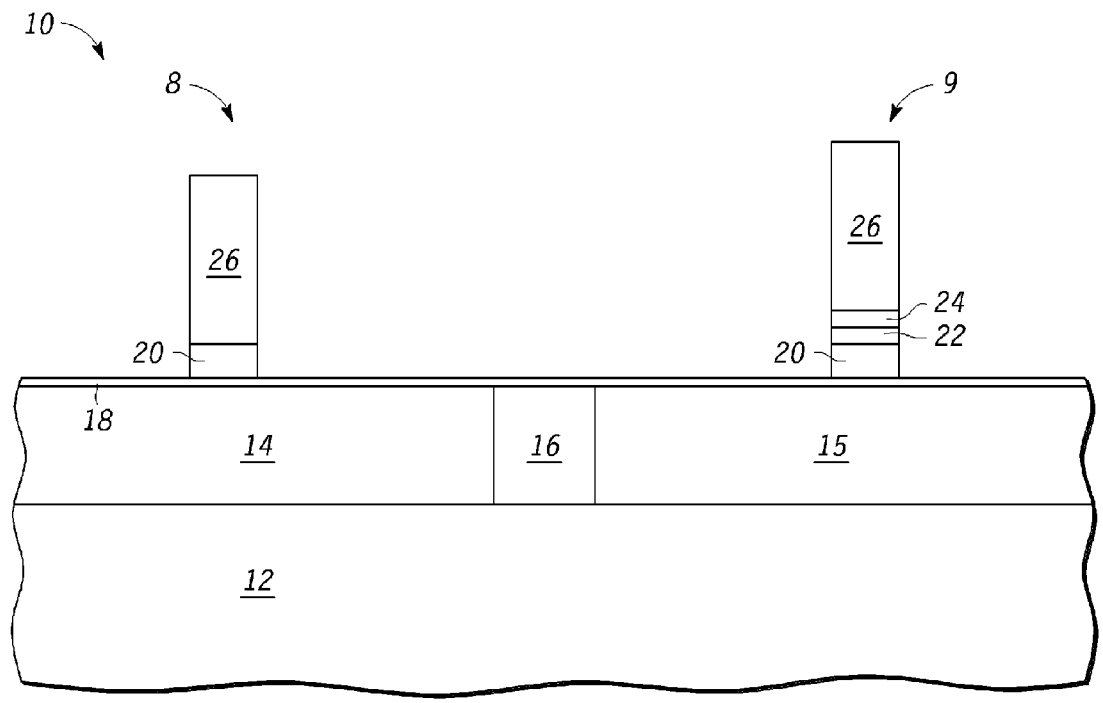
FIG. 7 is a cross section of the semiconductor device at a stage in the process subsequent to that shown in FIG. 6.

Shown in FIG. 7 is semiconductor device structure 10 after a mask and etch step for gates. This etch extends to dielectric layer 18. The etch leaves a gate stack in region 8 for use as a gate for an N channel transistor over semiconductor layer 14 comprised of a portion of metal layer 20 and a portion of polysilicon layer 26. Also remaining is a gate stack in region 9 for use as a gate for a P channel transistor over semiconductor layer 15 comprised of a portion of metal layer 20, a portion of layer 22, a portion of metal layer 24, and a portion of polysilicon layer 26.

Figure 8:
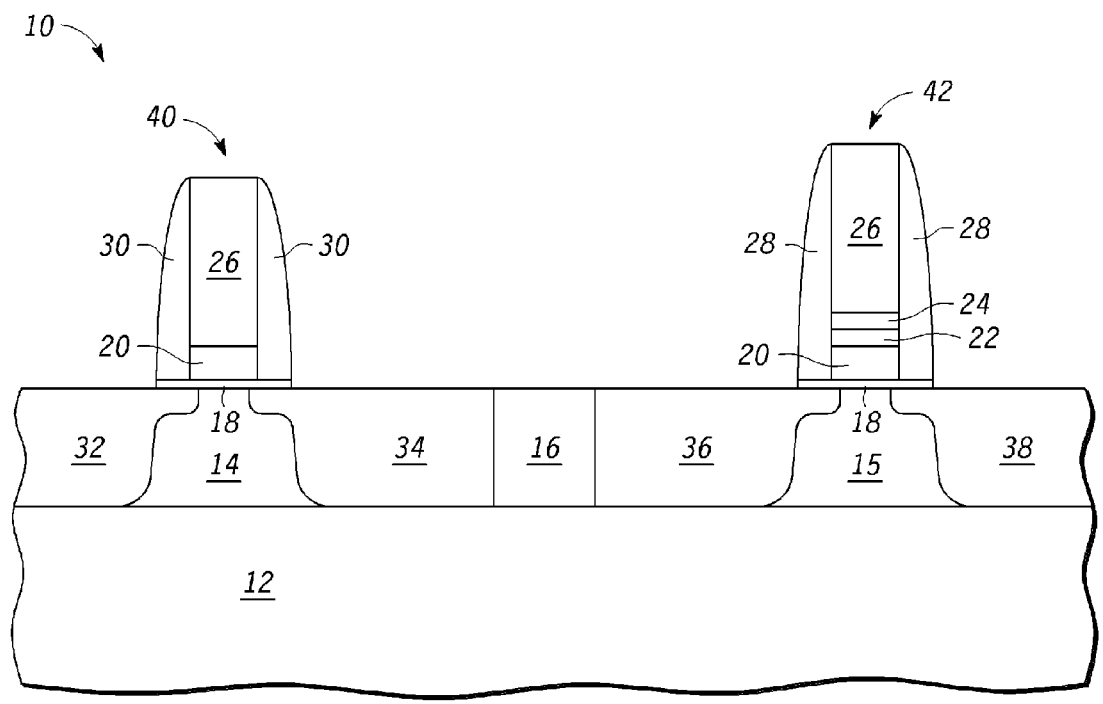
FIG. 8 is a cross section of the semiconductor device at a stage in the process subsequent to that shown in FIG. 7.

Shown in FIG. 8 is semiconductor device structure 10 after completing formation, in conventional fashion, of an N channel transistor 40 and a P channel transistor 42 using the gate stacks from FIG. 7. N channel transistor 40 comprises the gate stack from region 8, a sidewall spacer 30 around the gate stack, a gate dielectric as a portion of dielectric layer 18, a source/drain 32 in semiconductor layer 14 on one side of the gate stack, and a source/drain 34 in semiconductor layer 14 on the other side of the gate stack. N channel transistor 40 has a channel in semiconductor layer 14 between source/drains 32 and 34 P channel transistor 42 comprises the gate stack from region 9, a sidewall spacer 28 around the gate stack, a gate dielectric as a portion of dielectric layer 18, a source/drain 36 in semiconductor layer 15 on one side of the gate stack, and a source/drain 38 in semiconductor layer 15 on the other side of the gate stack. P channel transistor 42 has a channel in semiconductor layer 15 between source/drain regions 36 and 38.

In the transistor forming process, which is conventional, there is substantial heating, especially in activating the source/drains which are first implanted then need heating for activation. A typical annealing step for activating source/drains is over one thousand degrees Celsius for a few seconds. This anneal step is sufficient to cause an increase of about 600 millivolts (mV) in the work function of metal layer 20 in transistor 42 but not transistor 40 due to the action of layer 22, which is oxygen-bearing. With TaC having a work function of about 4.3 eV, it is only 0.2 eV above the optimum work function for an N channel transistor. The work function for layer 20 of transistor 42 becomes 4.9 eV. With the optimum work function for P channel transistors being 5.2 eV, the work function of 4.9 eV is 0.3 eV below the optimum. Although it would be preferable to have near 5.2 eV as the work function, that has been difficult to achieve unless different metals are deposited for the N and P channel transistors. When different metals are used, it is necessary to remove a metal from a side with one doping type so that another metal can be deposited in contact with the gate dielectric. This exposes the gate dielectric to an etch chemistry which can damage the gate dielectric. In such a situation, there are adverse electrical effects on the transistors formed from the second metal which are formed on the damaged dielectric or on a re-formed dielectric. A typical problem is excessive leakage.

The increase in work function due to the presence of the oxygen-bearing metal on the underlying metal layer is effective over a relatively large range of thicknesses. Metal layer 20 needs to be thick enough to successively retard oxygen movement into the gate dielectric and thin enough to have its work function increased by the anneal of the oxygen-bearing metal. A thickness of as low as 10 Angstroms for layer 22, the conductive oxygen-bearing metal, has been found to provide a several eV increase for a thickness of 50 Angstroms for metal layer 20. A thickness of 120 Angstroms for metal layer 20 has been able to have its work function comparably increased by the oxygen-bearing metal.

Various other changes and modifications to the embodiments herein chosen for purposes of illustration will readily occur to those skilled in the art. For example, the doping of the source/drain regions may be achieved in some other fashion such as in situ doping during epitaxial growth. To the extent that such modifications and variations do not depart from the spirit of the invention, they are intended to be included within the scope thereof which is assessed only by a fair interpretation of the following claims.

What is claimed is:

1. A method for forming a semiconductor device comprising:
   providing a semiconductor layer, wherein the semiconductor layer has a first region;
   forming a dielectric layer over the first region;
   forming a first metal layer over the dielectric layer having a first thickness;
   forming an oxygen bearing metal layer over the first metal layer having a second thickness less than the first thickness; and
   forming a second metal layer over the oxygen bearing metal layer.

2. The method of claim 1, wherein the first region is doped n-type.

3. The method of claim 2, wherein the oxygen bearing metal layer forms at least a part of a gate electrode for a p-channel complementary metal oxide semiconductor (PMOS) transistor.

4. The method of claim 1, wherein forming the first metal layer further comprises forming a material selected from the group consisting of TaC and TaSiN.

5. The method of claim 1, wherein the dielectric layer comprises at least one of $HfO_xN_y$, $HfSi_xO_y$, $HfSi_xO_yN_z$, $HfZr_xO_yN_z$, $HfZr_xSi_yO_zN_q$, $HfZr_xO_y$, $ZrSi_{xOy}$, $ZrSi_xO_yN_z$, $ZrO_2$, $SiO_2$, $SiO_xN_y$, and other Hf-containing or Zr-containing dielectric materials.

6. The method of claim 1, wherein forming the oxygen bearing metal layer further comprises forming the oxygen bearing metal layer comprising at least one element selected from the group consisting of Ir, Mo, Ru, W, Os, Nb, Ti, V, Ni, Rh, and Re.

7. The method of claim 1, wherein forming the second metal layer further comprises forming a TiN layer.

8. The method of claim 1, further comprising forming a polysilicon layer over the second metal layer.

9. A method for forming a semiconductor device comprising:
   providing a semiconductor layer, wherein the semiconductor layer has a first region and a second region, and the first region has a different dopant type than the second region;
   forming a dielectric layer over the first region and the second region;
   forming a first metal layer over the dielectric layer having a first thickness, wherein the first thickness is between 50 and 70 Angstroms;
   forming an oxygen bearing metal layer over the first metal layer having a second thickness, wherein the second thickness is between 10 and 20 Angstroms;
   forming a second metal layer over the oxygen bearing metal layer;
   removing the oxygen bearing metal layer and the second metal layer from over the second region; and
   forming a polysilicon layer over the first metal layer in the first region and over the second metal layer in the second region.

10. The method of claim 9, wherein forming the first metal layer further comprises forming a material selected from the group consisting of TaC and TaSiN.

11. The method of claim 9, wherein the dielectric layer comprises at least one of $HfO_xN_y$, $HfSi_xO_y$, $HfSi_xO_yN_z$, $HfZr_xO_yN_z$, $HfZr_xSu_yO_zN_q$, $HfZr_xO_y$, $ZrSi_xO_y$, $ZrSi_xO_yN_z$, $ZrO_2$, $SiO_2$, $SiO_xN_y$, and other Hf-containing or Zr-containing dielectric materials.

12. The method of claim 9, wherein forming the oxygen bearing metal layer further comprising forming the oxygen bearing metal layer comprising at least one element selected from the group consisting of Ir, Mo, Ru, W, Os, Nb, Ti, V, Ni, Rh, and Re.

13. The method of claim 9, wherein forming the second metal layer further comprises forming a TiN layer.

14. The method of claim 9, further comprising:
patterning the polysilicon layer, the second metal layer, the oxygen bearing metal layer, and the first metal layer in the first region to form a gate electrode for a p-channel complementary metal oxide semiconductor (PMOS) transistor; and
patterning the polysilicon layer and the first metal layer in the second region to form a gate electrode for an n-channel complementary metal oxide semiconductor (NMOS) transistor.

15. The method of claim 14, further comprising annealing the semiconductor device.

16. The method of claim 1, further comprising performing an anneal after the step of forming the oxygen-bearing metal layer, wherein the first thickness is sufficiently thick to function as a barrier to oxygen migration from the oxygen-bearing metal layer to the dielectric layer and sufficiently thin to have a work function increase due to oxygen migration from the oxygen-bearing metal layer in response to the step of performing an anneal.

17. The method of claim 16, wherein the first thickness is between 50 and about 70 Angstroms.

18. The method of claim 17, wherein the second thickness is between 10 and about 20 Angstroms.

19. The method of claim 16, wherein the work function increase comprises about 600 millivolts.

* * * * *